United States Patent
Le et al.

(10) Patent No.: US 6,181,624 B1
(45) Date of Patent: Jan. 30, 2001

(54) INTEGRATED CIRCUIT MEMORY HAVING A SENSE AMPLIFIER ACTIVATED BASED ON WORD LINE POTENTIALS

(75) Inventors: Thoai-Thai Le, München; Jürgen Lindolf, Friedberg; Helmut Schneider, München, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/398,695

(22) Filed: Sep. 20, 1999

(30) Foreign Application Priority Data

Sep. 18, 1998 (DE) .............................................. 198 42 852

(51) Int. Cl.$^7$ .................................................... G11C 7/08
(52) U.S. Cl. .......................... 365/210; 365/208; 365/205; 365/190; 365/195; 365/196; 365/189.08; 365/230.06; 365/233
(58) Field of Search .................................... 365/205, 207, 365/208, 210, 190, 189.08, 195, 196, 230.06, 233, 233.5

(56) References Cited

U.S. PATENT DOCUMENTS

| | | | |
|---|---|---|---|
| 4,498,154 | * 2/1985 | Hoffmann | 365/149 |
| 4,653,023 | 3/1987 | Suzuki et al. | 365/104 |
| 4,807,193 | 2/1989 | Takemae et al. | 365/205 |
| 5,132,931 | 7/1992 | Koker | 365/210 |
| 5,251,168 | 10/1993 | Chung et al. | 365/51 |
| 5,394,354 | 2/1995 | Watabe et al. | 365/51 |

OTHER PUBLICATIONS

IBM Technical Disclosure Bulletin: "Word Line Detector Circuit", vol. 29, No. 6, Nov. 1986, pp. 2650–2651.

* cited by examiner

*Primary Examiner*—Andrew Q. Tran
(74) *Attorney, Agent, or Firm*—Herbert L. Lerner; Laurence A. Greenberg; Werner H. Stemer

(57) ABSTRACT

An integrated memory has memory cells disposed in a cell array at crossover points of bit lines and word lines for storing information items. In addition, the memory has a word line decoder by which the word lines can be addressed, and at least one evaluation unit for evaluating the information items read from the memory cells onto the bit lines and the evaluation unit has an activation input. In addition, the integrated memory has a logic unit for performing an OR function and has inputs connected to that end of each of the word lines which is remote from the word line decoder. The logic unit further has an output connected to the activation input of the evaluation unit. The logic unit serves for time-optimized activation of the evaluation unit as soon as one of the word lines has been selected by the word line decoder.

4 Claims, 3 Drawing Sheets

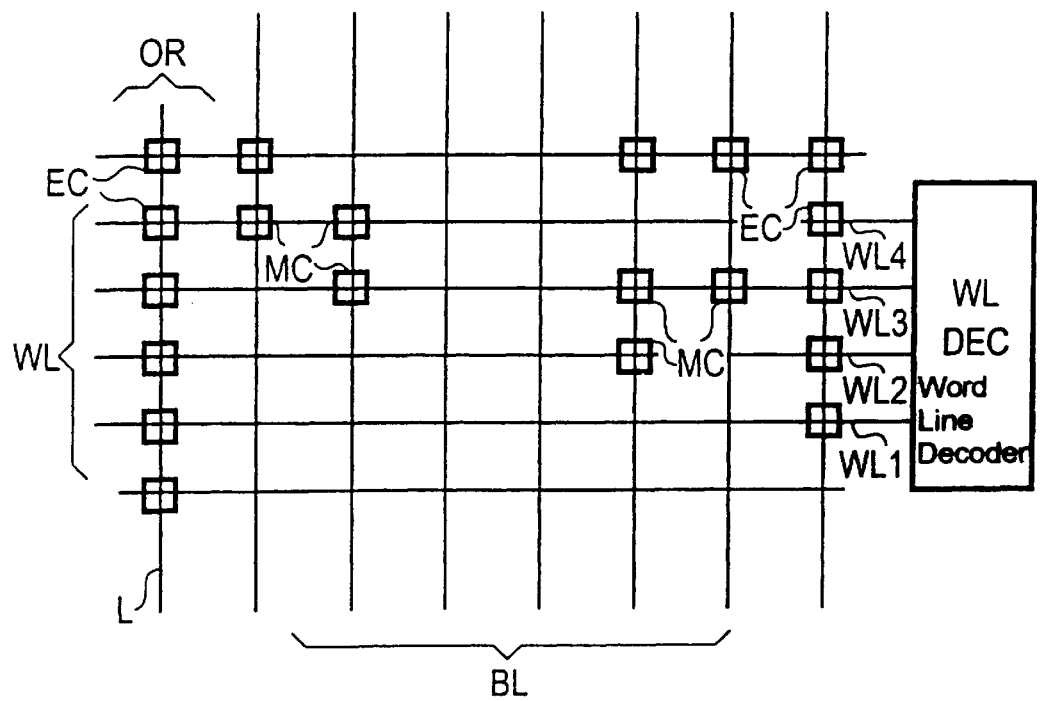
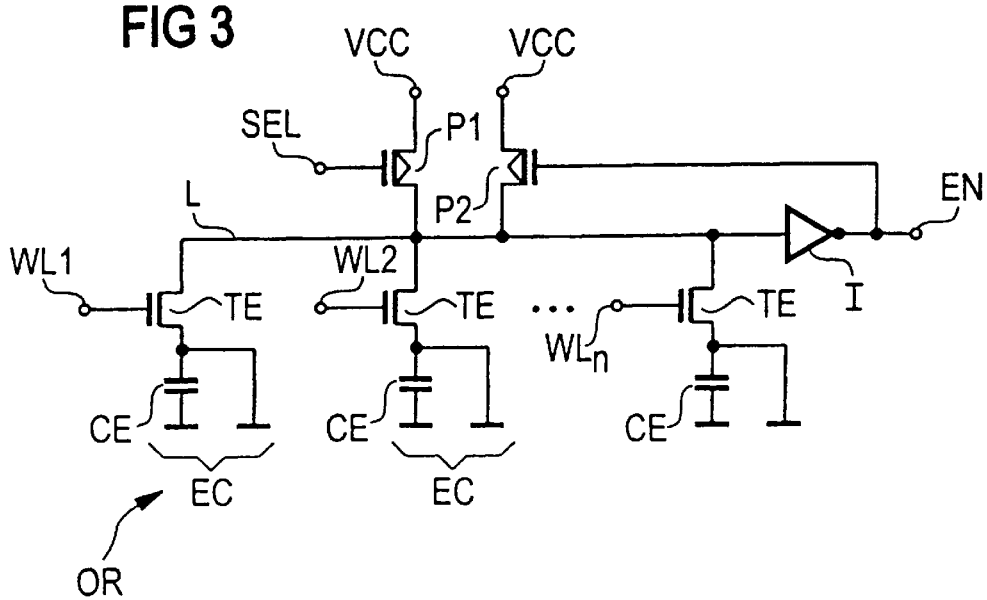

INTEGRATED CIRCUIT MEMORY HAVING A SENSE AMPLIFIER ACTIVATED BASED ON WORD LINE POTENTIALS

BACKGROUND OF THE INVENTION

Field of the Invention

The invention relates to an integrated memory.

U.S. Pat. No. 4,807,193 describes a DRAM having memory cells of the one-transistor/one-capacitor type. Signals read from one of the memory cells onto a bit line are amplified by a sense amplifier. In this case, the memory cell is selected via a word line connected to a control terminal of the memory cell transistor. To ensure that the sense amplifier amplifies the information items that have been read out in good time, it has an activation input, to which an activation signal is fed which is dependent on the potential on the word line. This is intended to ensure that the sense amplifier only becomes active if the potential on the word line has reached a specific level, so that it can be assumed that the memory cell has already been selected via the word line. U.S. Pat. No. 4,807,193 relates to a memory with only one word line.

SUMMARY OF THE INVENTION

It is accordingly an object of the invention to provide an integrated memory which overcomes the above-mentioned disadvantages of the prior art devices of this general type, which has a multiplicity of word lines and bit lines, in the case of which memory activation of at least one evaluation unit for evaluating information items read from the memory cells onto the bit lines is effected in a time-optimized manner at least for a plurality of the word lines.

With the foregoing and other objects in view there is provided, in accordance with the invention, an integrated memory, including:

bit lines;

word lines each having a remote end and intersecting the bit lines;

a cell array having memory cells for storing information items, the memory cells are disposed at crossover points of the bit lines and the word lines;

a word line decoder connected to and addressing the word lines;

at least one evaluation unit has an activation input and is connected to the bit lines, the at least one evaluation unit evaluating the information items read from the memory cells and deposited onto the bit lines; and a logic unit for performing an OR function having inputs connected to the remote end of each of the word lines being remote from the word line decoder and having an output connected to the activation input of the at least one evaluation unit.

The integrated memory according to the invention has memory cells for storing information items, which are disposed in a cell array at crossover points of bit lines and word lines. Furthermore, it has a word line decoder, by which the word lines can be addressed, and at least one evaluation unit for evaluating information items read from the memory cells onto the bit lines and the evaluation unit has an activation input. Moreover, it has a logic unit for performing an OR function having inputs connected to that end of each of the word lines which is remote from the word line decoder, and has an output connected to the activation input of the evaluation unit.

The integrated memory may be any desired memory having bit lines and word lines as well as at least one corresponding evaluation unit. Therefore, the invention is suitable both for writeable memories such as DRAMs, SRAMs, flash memories and EEPROMs and for read-only memories (ROMs).

Since the logic unit is connected to those ends of the word lines which are remote from the word line decoder, selection of a specific one of the word lines by the decoder and an associated change in the potential of the word line affect the inputs of the logic unit only when the entire word line has undergone charge reversal. The propagation of the new signal level on the word line takes place proceeding from the decoder in the direction of that end of the word line which is remote from the decoder. Connecting the logic unit to the ends of the word lines therefore has the advantage that even that memory cell of the memory cells connected to the word line which is the furthest away from the decoder has been reliably selected if the level change of the word line currently addressed by the decoder has an effect at the input of the logic unit. Consequently, the logic unit influences the activation input of the evaluation unit only when a level change becomes apparent at that end of the respective word line which is remote from the word line decoder. The invention furthermore has the advantage that the activation of the evaluation unit is carried out in a time-optimized manner for all of the word lines connected to the logic unit. This is ensured by the OR function of the logic unit. For each individual word line of the word lines connected to the logic unit, the evaluation unit is activated only when a level change has occurred at the respective input of the logic unit.

According to a development of the invention, the integrated memory is a dynamic memory (DRAM) of the one-transistor/one-capacitor type, whose memory cells each have a storage capacitor, whose first electrode is connected to a fixed first potential and whose second electrode is connected to one of the bit lines via a selection transistor. Furthermore, its cell array has end cells at its edge, which end cells, in contrast to the memory cells, do not serve for storing information items but rather for optimizing a process for fabricating the memory cells and are configured essentially like the memory cells, in each case with a capacitor as well as a selection transistor. In this case, at least some of those end cells which are disposed on a side of the cell array which is remote from the word line decoder are component parts of the logic unit and control inputs of the selection transistors of these end cells are the inputs of the logic unit. In this case, that terminal of the selection transistors of the end cells which is remote from the capacitor is connected to a line which is connected to the output of the logic unit, and that terminal of the capacitor of the end cells which faces the selection transistor is connected to a fixed second potential.

The end cells, which serve for process optimization during the fabrication of the memory cells, promote, during the fabrication, the production of the different layers from which the integrated memory is fabricated. By way of example, the storage capacitors of the memory cells may be trench capacitors. In order to fabricate them, trenches are produced in a substrate and the capacitors with their electrodes are formed in the trenches. Since these trenches have to be filled with different materials for the purpose of fabricating the electrodes and/or for the purpose of carrying out subsequent fabrication steps, irregularities such as e.g. elevations are produced at the edge of a memory cell array to be fabricated with trench capacitors in the course of the application of the layers. This is due to the fact that the trenches of the memory cell array take up a larger amount of the layer material than the regions next to the memory cell array which do not have trenches. Therefore, end cells, which do not usually have an electrical function, are produced in addition to the memory cells at the edge of the cell array. Since the end cells are configured essentially like the memory cells, the capacitors of the end cells are likewise trench capacitors, if the storage capacitors of the memory cells are trench capacitors. As a result of the end cells at the edge of the memory cell array, it is then ensured that the layers produced in the region of the memory cells which are situated within the memory cell array are very uniform. Any influencing of the layers produced by the transition between trench structures present in the cell array and regions without trenches outside the memory cell array then occurs only in the edge region of the cell array, where the end cells are disposed. The memory cells remain uninfluenced by this.

The described development of the invention has the advantage that the end cells that do not usually serve an electrical function are used for realizing the logic unit. This obviates corresponding additionally necessary components that would have to be provided if the end cells were not used for realizing the logic unit. Therefore, the space required by the logic unit is relatively small.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block circuit diagram of a memory cell array of the integrated memory from FIG. 1 with end cells and memory cells;

FIG. 3 is a schematic diagram of a detail of a logic unit from FIG. 1;

DESCRIPTION OF THE PREFERRED EMBODIMENTS

Figure 1:
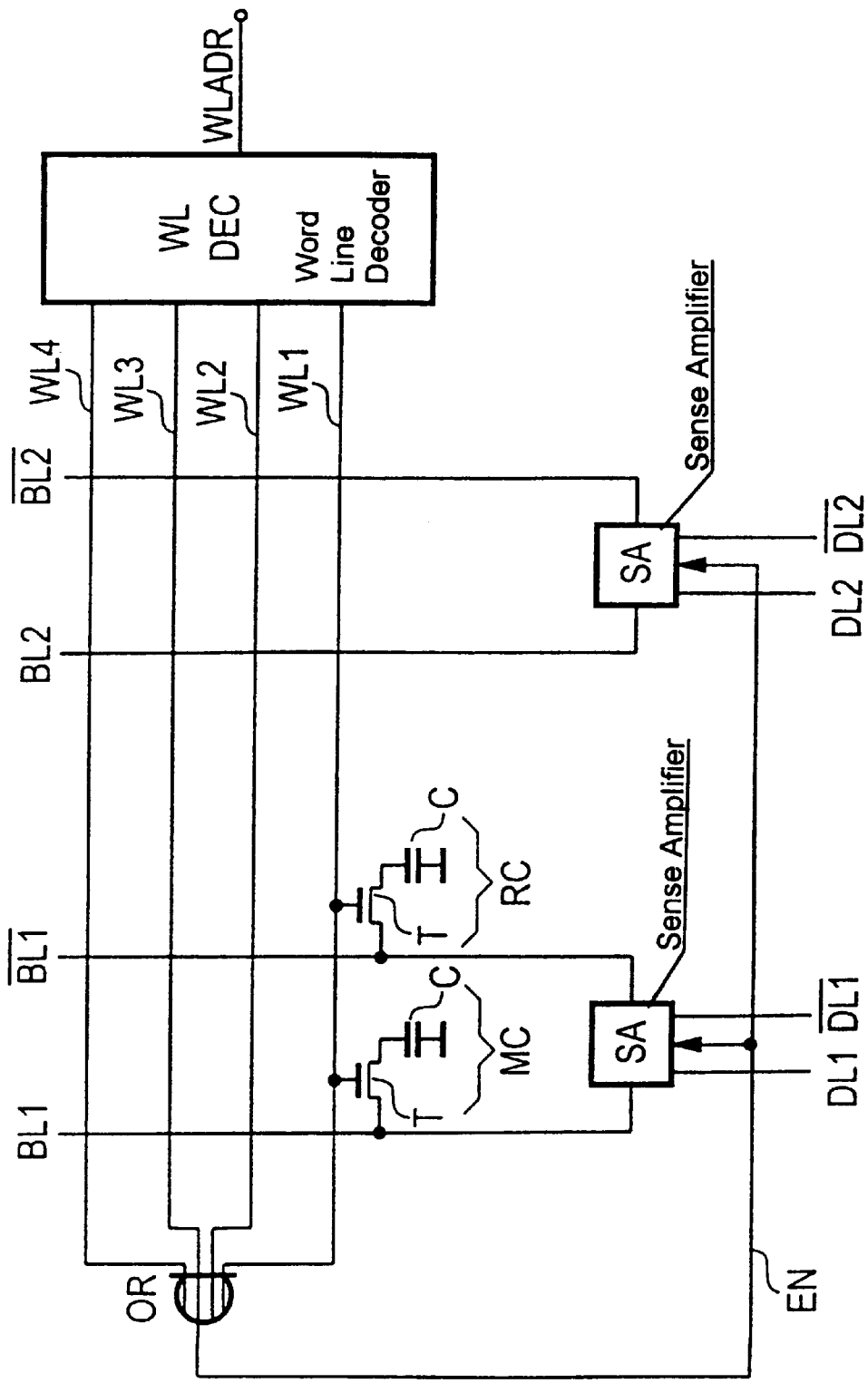
FIG. 1 is a diagrammatic, block circuit diagram of an exemplary embodiment of an integrated memory according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated memory of the DRAM type having a multiplicity of word lines WLi running horizontally and a multiplicity of bit line pairs BLk, /BLk running vertically. The DRAM has memory cells MC of a one-transistor/one-capacitor type. Between the bit lines BLk, /BLk and ground, the memory cells MC have a selection transistor T of the n-channel type and a storage capacitor C. A control terminal of the selection transistor T is connected to one of the word lines WLi. The word lines WLi are connected to outputs of a word line decoder WLDEC. Word line addresses WLADR, by which the word lines WLi can be addressed, are fed to the word line decoder WLDEC on an input side. Although real memories have a large number of word lines and bit lines, only a few of these lines are shown for the purpose of illustration in FIG. 1.

The bit line pairs BLk, /BLk are connected to evaluation units SA in the form of sense amplifiers SA, which serve for evaluating, and that is to say amplifying, the information items read from the memory cells MC onto the bit lines BLk, /BLk. The sense amplifiers SA pass the information items on amplified to data line pairs DLk, /DLk. In the case of the memory from FIG. 1, the information items read out are fed to the sense amplifier SA as a differential signal on the respective bit line pair BLk, /BLk, which sense amplifier SA passes the amplified information on likewise as a differential signal on the corresponding data line pair DLk, /DLk. If a first bit line BL1 is addressed by a bit line decoder (not illustrated in FIG. 1), the associated second bit line /BL1 of the bit line pair is simultaneously activated. The content of the memory cell MC is read out onto the first bit line BL1 and the content of a reference cell RC is read out onto the second bit line /BL1 of this data line pair. The sense amplifier SA amplifies the differential signal in a customary manner in the activated state.

In the case of the DRAM from FIG. 1, the word lines WLi have a low potential if they are not addressed by the word line decoder WLDEC. If one of the word lines WLi is activated by the word line decoder WLDEC, it has a high level, with the result that the selection transistors T connected to it are turned on. In this case, in the event of activation of one of the word lines WLi, the high level propagates with a certain propagation delay from the corresponding output of the word line decoder WLDEC as far as that end of the respective word line WLi which is situated in the left-hand region of FIG. 1 and is remote from the word line decoder WLDEC.

Those ends of the word lines WLi which are remote from the word line decoder WLDEC in FIG. 1 are connected to inputs of a logic unit in the form of an OR gate OR. An output of the OR gate OR is connected to a respective activation input of the sense amplifiers SA. As long as an activation signal EN, which is generated by the OR gate OR on this line, has a low level, the sense amplifiers SA are deactivated and do not output any information onto the data lines DLk, /DLk. In the event of a high level of the activation signal EN, the sense amplifiers SA are activated and perform their amplifier function. The activation signal EN has a low level whenever none of the word lines WLi connected to the OR gate OR has been activated by the word line decoder WLDEC. As soon as one of the word lines WLi has been activated by the word line decoder WLDEC and the high signal level has propagated through to the end of the word line, the OR gate OR likewise generates a high level at its output and activates the sense amplifiers SA connected to it.

Since the inputs of the OR gate OR in FIG. 1 are connected to those ends of the word lines WLi which are remote from the word line decoder WLDEC, the sense amplifiers SA are activated by the activation signal EN only when the memory cells MC which are furthest away from the word line decoder WLDEC have also been selected via their selection transistors T.

FIG. 2 shows an exemplary embodiment of the memory cell array of the DRAM from FIG. 1 in a topological illustration showing the local configuration of the memory cells MC. Once again the bit lines BL run vertically and the word lines WL horizontally. The memory cells MC are situated at crossover points of the word lines WLi and bit lines BLk within the memory cell array. An edge of the memory cell MC is formed by a row of end cells EC surrounding the memory cells MC. The end cells EC are configured essentially like the memory cells MC and therefore likewise have a capacitor CE and a selection transistor TE (FIG. 3).

Figure 4:
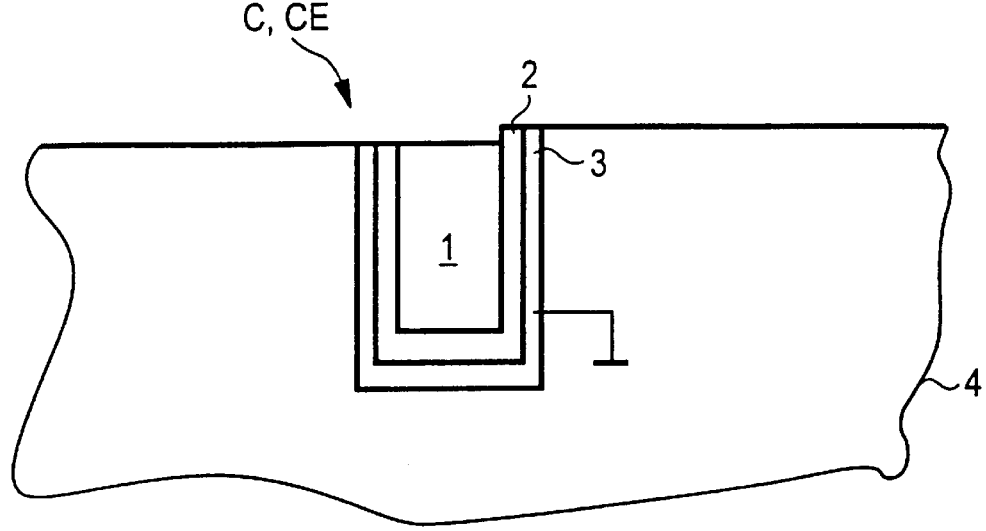
FIG. 4 is a fragmentary, sectional view of an exemplary embodiment of a storage capacitor.

In the present case, the capacitors C of the memory cells MC and the capacitors CE of the end cells EC are in each case trench capacitors of the type illustrated in FIG. 4. The trench capacitors C and CE of the memory cells MC and the end cells EC, respectively, has a first electrode 3, which is connected to ground, and a second electrode 1, which is connected to the associated selection transistor T; TE, in a substrate 4 of the integrated memory, in a trench produced therein. Situated between the two electrodes 1, 3 is an insulating layer 2 being a dielectric.

The end cells EC at the edge of the cell array in FIG. 2 serve to ensure that the trench capacitors C of the memory cells MC are fabricated as uniformly as possible during the fabrication of the integrated memory. Since regions of the integrated memory which have no trenches during its fabrication are disposed outside the cell array illustrated, the result is that the process for fabricating the trench capacitors C is influenced during the fabrication in a transition region between the regions with trenches and the regions without trenches. It is favorable, therefore, to space the memory cells MC apart from the regions outside the memory cell array by providing the end cells EC. Irregularities in the course of the fabrication of the cells then affect only the trench capacitors CE of the end cells EC, and not the capacitors C of the memory cells MC.

Usually, the end cells EC of this type only serve the described purpose of process optimization during the fabrication of the memory. In that case, they serve no electrical or logical function at all once the memory has been completed. In this exemplary embodiment of the invention, however, the end cells EC, whose selection transistors TE are connected to a line L situated at that edge of the cell array which is remote from the word line decoder WLDEC, are used for realizing the logic unit OR. This is explained below with reference to FIG. 3.

FIG. 3 shows the end cells EC with their capacitor CE and their selection transistor TE, which are connected to the line L illustrated in FIG. 2. Control terminals of the selection transistors TE of the end cells EC are likewise connected to one of the word lines WLi. In terms of their structure, the end cells EC differ from the memory cells MC only in one detail: that the electrode of the capacitors CE which faces the selection transistor TE is connected to ground. If one of the word lines WLi is addressed by the word line decoder WLDEC and the high level set in response to this propagates as far as the end of the word line, where the end cell EC connected to this end is situated, the selection transistor TE of the end cell is turned on, with the result that the line L is pulled to ground. An inverter I connected to the line L generates the activation signal EN from FIG. 1 at the output of the logic unit OR illustrated in FIG. 3.

The line L in FIG. 3 is precharged to a high level by a selection signal SEL before the activation of one of the word lines WLi, that is to say with the selection transistors TE of the end cells EC turned off, with the result that the activation signal EN at the output of the logic unit OR initially has a low level. This precharging is effected by a first p-channel transistor P1, which is disposed with its main current path between a positive supply potential VCC and the line L. Its control terminal is connected to the selection signal SEL. A second p-channel transistor P2, which is disposed with its main current path in parallel with the first p-channel transistor P1, has a control input connected to the output of the logic unit OR. The inverter I and the second p-channel transistor P2 form a holding circuit which holds the potential state of the line L after the first p-channel transistor P1 has already been turned off again.

Figure 5:
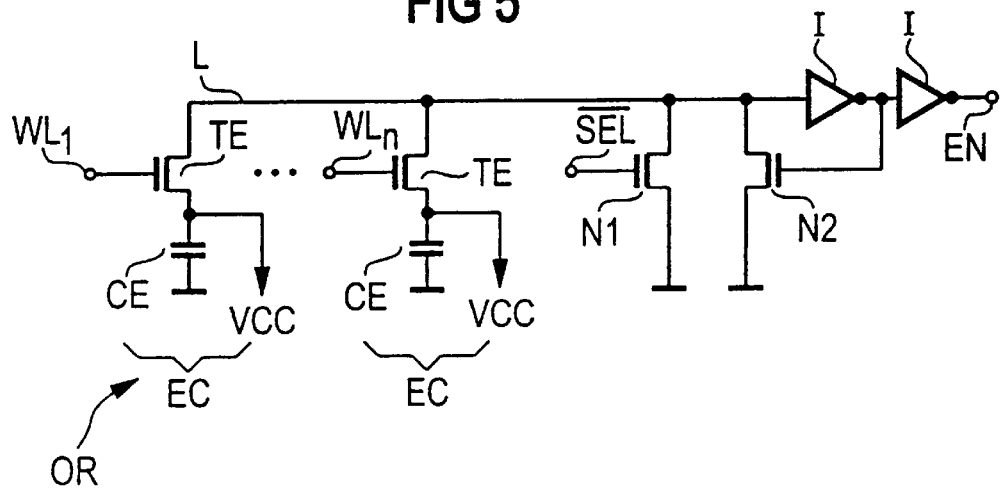
FIG. 5 is a schematic diagram of an alternative embodiment of the logic unit.

FIG. 5 shows an alternative way of connecting up the end cells EC for the purpose of forming the logic unit OR. In the case of the end cells EC, the electrode of the storage capacitor CE which is connected to the selection transistor TE is not connected to ground but rather to a positive supply potential VCC of the memory in order to precharge the line L, the latter being connected to ground via a first n-channel transistor N1, the gate of which is connected to a control signal /SEL. The line L is additionally connected to the output of the logic unit OR via two series-connected inverters I, at which output the logic unit generates the activation signal EN. The line L is connected to ground via a second n-channel transistor N2, the gate of which is connected to the output of the first inverter I. The realization of the logic unit OR illustrated in FIG. 5 has the advantage that the sense amplifier SA is activated by the activation signal EN only when the selection transistor TE of one of the end cells EC is turned on to such an extent that it connects the supply potential VCC applied to it to the line L, as a result of which a switching threshold of the first inverter I is exceeded. Only when the potential of the word line WLi connected to the respective end cell EC has risen far enough does the activation signal EN change from a low level to a high level. Since the end cells EC are disposed at the edge of the cell array, that is to say at the end of the respective word line WLi, it is ensured that, in the event of the positive edge of the activation signal EN, the selection transistor T of the selected memory cell MC has also been turned on to a sufficient extent via this word line. Thus, the logic unit OR in FIG. 5 causes the activation signal EN to change from the low level to the high level later in comparison with the logic unit from FIG. 3.

We claim:

1. An integrated memory, comprising:

bit lines;

word lines each having a remote end and intersecting said bit lines;

a cell array having an edge, end cells disposed at said edge, and dynamic memory cells for storing information items, said memory cells disposed at crossover points of said bit lines and said word lines, and each of said memory cells having a selection transistor and a storage capacitor with a first electrode connected to a fixed first potential and a second electrode connected to one of said bit lines through said selection transistor;

a word line decoder connected to and addressing said word lines;

at least one evaluation unit having an activation input and connected to said bit lines, said at least one evaluation unit evaluating the information items read from said memory cells and deposited onto said bit lines; and a logic unit for performing an OR function having inputs connected to said remote end of each of said word lines being remote from said word line decoder and having an output connected to said activation input of said at least one evaluation unit, said end cells not serving for storing the information items but rather for optimizing a process for fabricating said memory cells and being substantially like said memory cells, said end cells having in each case an end cell capacitor and an end cell selection transistor with a control input, at least some of said end cells disposed on a side of said cell array remote from said word line decoder are component parts of said logic unit and said control input of said end cell selection transistor of said at least some of said end cells are said inputs of said logic unit.

2. The integrated memory according to claim 1, including a line connected to said output of said logic unit, said end cell selection transistor having a terminal remote from said end cell capacitor that is connected to said line, and said end cell capacitor having a terminal facing said end cell selection transistor that is connected to a fixed second potential.

3. The integrated memory according to claim 2, wherein said storage capacitor and said end cell capacitor are trench capacitors.

4. The integrated memory according to claim 2, wherein the fixed first potential is the same as the fixed second potential.

* * * * *